(12) United States Patent
Park

(10) Patent No.: US 12,317,595 B2
(45) Date of Patent: May 27, 2025

(54) LIGHT EMITTING DISPLAY DEVICE

(71) Applicant: LG Display Co., Ltd., Seoul (KR)

(72) Inventor: Hyungju Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 238 days.

(21) Appl. No.: 17/865,300

(22) Filed: Jul. 14, 2022

(65) Prior Publication Data

US 2022/0359576 A1 Nov. 10, 2022

Related U.S. Application Data

(63) Continuation of application No. 17/009,109, filed on Sep. 1, 2020, now Pat. No. 11,398,501, which is a
(Continued)

(30) Foreign Application Priority Data

Jul. 25, 2017 (KR) .......................... 10-2017-0094328

(51) Int. Cl.
| | |
|---|---|
| *H10D 86/60* | (2025.01) |
| *G02B 5/20* | (2006.01) |
| *G09G 3/32* | (2016.01) |
| *H01L 25/075* | (2006.01) |
| *H10D 30/67* | (2025.01) |

(Continued)

(52) U.S. Cl.
CPC ............ *H10D 86/60* (2025.01); *G02B 5/201* (2013.01); *G09G 3/32* (2013.01); *H01L 25/0753* (2013.01); *H10D 30/6729* (2025.01); *H10D 30/673* (2025.01); *H10D 86/411* (2025.01); *H10D 86/441* (2025.01); *H10H 20/814* (2025.01); *H10H 20/8252* (2025.01); *H10H 20/833* (2025.01); *G02F 2201/121* (2013.01); *G02F 2201/123* (2013.01); *H01L 2223/54426* (2013.01); *H10H 20/018* (2025.01)

(58) Field of Classification Search
CPC ............................. H01L 23/544; H01L 25/13
See application file for complete search history.

(56) References Cited

U.S. PATENT DOCUMENTS

| 5,206,749 A | 4/1993 | Zavracky et al. |
|---|---|---|
| 2002/0096994 A1 | 7/2002 | Iwafuchi et al. |

(Continued)

FOREIGN PATENT DOCUMENTS

| CN | 1447958 A | 10/2003 |
|---|---|---|
| CN | 1649148 A | 8/2005 |

(Continued)

OTHER PUBLICATIONS

Office Action dated May 27, 2021, issued in corresponding Chinese Patent Application No. 201810775986.8.
(Continued)

*Primary Examiner* — Yu-Hsi D Sun
(74) *Attorney, Agent, or Firm* — Morgan, Lewis & Bockius LLP

(57) ABSTRACT

A display device is disclosed. The display device includes a substrate having a plurality of pixels, wherein each of the plurality of pixels includes at least one light emitting chip, and a structure on one side of at least one of the plurality of pixels. A base material of the light emitting chip is the same as a base material of the structure.

20 Claims, 8 Drawing Sheets

Related U.S. Application Data continuation of application No. 16/037,401, filed on Jul. 17, 2018, now Pat. No. 10,797,079.

(51) Int. Cl.
  *H10D 86/40* (2025.01)
  *H10H 20/814* (2025.01)
  *H10H 20/825* (2025.01)
  *H10H 20/833* (2025.01)
  *H10H 20/01* (2025.01)

(56) References Cited

U.S. PATENT DOCUMENTS

| | | |
|---|---|---|
| 2005/0161837 A1 | 7/2005 | Matsui |
| 2007/0117343 A1 | 5/2007 | Hwang et al. |
| 2007/0194416 A1 | 8/2007 | Vora |
| 2011/0133347 A1 | 6/2011 | Huang et al. |
| 2011/0291084 A1 | 12/2011 | Burroughes et al. |
| 2014/0103367 A1 | 4/2014 | Lin et al. |
| 2014/0183472 A1 | 7/2014 | Kim et al. |
| 2015/0262971 A1 | 9/2015 | Sekiya |
| 2016/0111604 A1 | 4/2016 | Li et al. |
| 2016/0351457 A1 | 12/2016 | Chen et al. |
| 2017/0090227 A1 | 3/2017 | Yun et al. |
| 2017/0186824 A1 | 6/2017 | Lee et al. |
| 2017/0323873 A1* | 11/2017 | Lin .................. H01L 24/05 |

FOREIGN PATENT DOCUMENTS

| | | |
|---|---|---|
| CN | 1971903 A | 5/2007 |
| CN | 102087488 A | 6/2011 |
| CN | 102239559 A | 11/2011 |
| CN | 103038902 A | 4/2013 |
| CN | 103779451 A | 5/2014 |
| CN | 104865789 A | 8/2015 |
| CN | 104885250 A | 9/2015 |
| CN | 106206651 A | 12/2016 |
| CN | 106530992 A | 3/2017 |
| EP | 2 506 316 A1 | 10/2012 |
| JP | 2009-251455 A | 10/2009 |
| KR | 10-2015-0064277 A | 6/2015 |
| KR | 10-2016-0057015 A | 5/2016 |
| KR | 10-2016-0072858 A | 6/2016 |
| KR | 10-2017-0038964 A | 4/2017 |
| KR | 10-2017-0078980 A | 7/2017 |

OTHER PUBLICATIONS

Extended European Search Report dated Jan. 4, 2019, issued in corresponding European Patent Application No. 18185262.5.
First Notification of Office Action dated Apr. 26, 2020, issued in corresponding Chinese Patent Application No. 201810775986.8.

* cited by examiner

O TYPE  C TYPE

LIGHT EMITTING DISPLAY DEVICE

This application is a Continuation Application of U.S. patent application Ser. No. 17/009,109, filed Sep. 1, 2020, which is a Continuation Application of U.S. patent application Ser. No. 16/037,401, filed Jul. 17, 2018, now U.S. Pat. No. 10,797,079, which claims the benefit of Korean Patent Application No. 10-2017-0094328, filed on Jul. 25, 2017. The entire disclosure of each of the above prior U.S. and Korean patent applications is hereby incorporated by reference herein for all purposes.

BACKGROUND

Technical Field

The present disclosure relates to a display device, and more particularly, to a light emitting display device having a light emitting diode and a method of manufacturing the same.

Background of the Related Art

Display devices are widely used as a display screen of a computer, a smart phone, a portable display device, and a portable information device.

The display devices can be classified into a reflection type display device and a light emitting display device. The reflection type display device is a display device in which natural light or light emitted from an external light source of the display device is reflected on the display device to display information. The light emitting display device is a display device that displays information by using light emitted from a light emitting element or a light source, which is embedded in the display device.

A plurality of pixels is arranged in the display device, and each of the pixels displays an image using a thin film transistor (TFT) as a switching element.

Representative display devices using the thin film transistor include liquid crystal display devices and organic light emitting display devices. Since a liquid crystal display device is not a self-emitting type, it has a backlight unit disposed on a lower portion (rear surface) of the liquid crystal display device. Therefore, thickness of the liquid crystal display device is increased and restrictions are imposed on the implementation of the liquid crystal display device in various types of designs, and luminance and response speed may be lowered.

A display device having a self-emitting element can be implemented to be thinner than a display device incorporating a light source, and has an advantage that a flexible and foldable display device can be implemented.

As described above, a display device such as an organic light emitting display device or a micro light emitting element display device having a self-emitting element has recently become a subject of major research and development.

Among the display devices having self-emitting elements, the organic light emitting display device is a display device using an organic light emitting element as a pixel. The organic light emitting display device is not required to have a separate light source, but is liable to cause a defect of a dark spot due to moisture and oxygen, so that various technical elements are further required to prevent penetration of oxygen and moisture.

Recently, research and development have been made on a light emitting display device in which a micro light emitting diode (LED) of a minute size is configured to correspond to a light emitting element, particularly a pixel of a display device. Such a light emitting display device is highly popular as a next-generation display device because of its high image quality and high reliability.

In more detail, LEDs are made of compound semiconductors such as GaN, so that high current can be injected to realize high luminance due to the characteristics of inorganic materials, and high reliability can be achieved because environmental impact such as heat, moisture and oxygen is low.

Further, since an internal quantum efficiency of the LED is higher than that of the organic light emitting display device by 90%, it is possible to implement a display device having a low consumption power while displaying a high luminance image.

Unlike the organic light emitting diode display, a separate sealing film or a sealing substrate for minimizing penetration of oxygen and moisture is not required, so that the non-display bezel area can be minimized.

However, in a display device using an LED as a light emitting element of an individual pixel, a price of the LED itself is high and a process cost for transplanting/transferring the LED into the display device may occur, so that this leads to a problem that the productivity is low.

SUMMARY

Accordingly, embodiments of the present disclosure are directed to a light emitting display device and a method of manufacturing the same that substantially obviate one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device having an LED element as a light emitting element is provided. A plurality of pixels is on a substrate. Each of the plurality of pixels includes at least one light emitting chip composed of the LED element. A structure capable of referring to a position where the LED element is disposed is arranged on the substrate so as to maintain a constant distance between the LED elements in a process of arranging the LED element in the pixel. The structure is disposed on one side of the light emitting chip in the pixel.

As described above, in arranging the light emitting chip on the substrate, the structures that can be referred to so as to maintain the distance between the light emitting chips constant are arranged on the substrate together. Therefore, the constant arrangement distance can be maintained.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
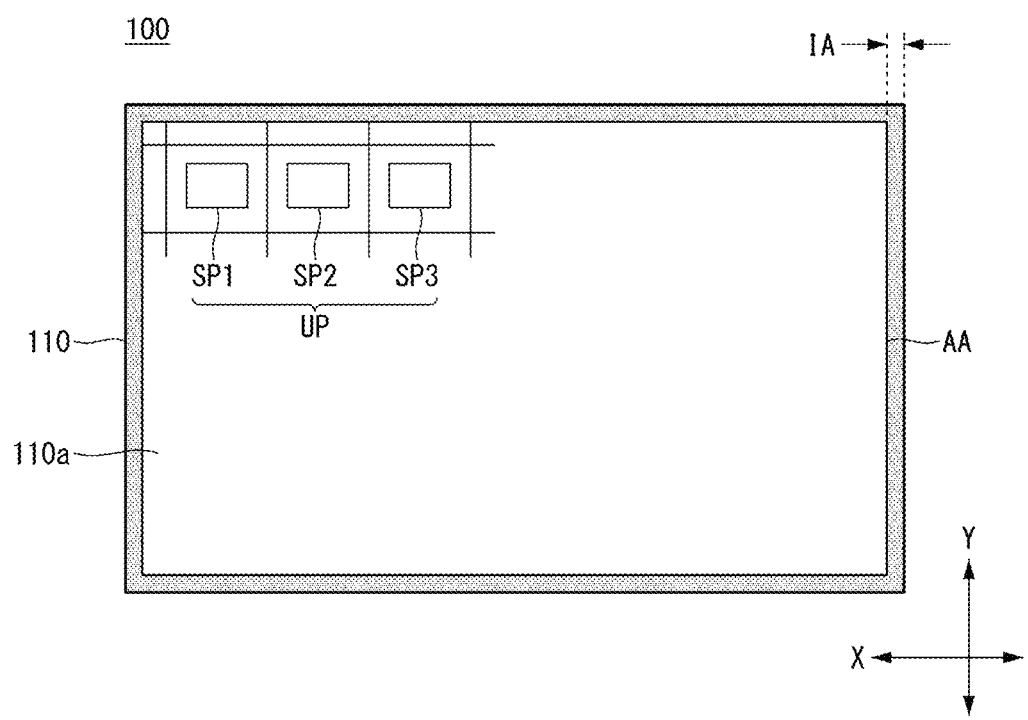
FIG. 1 is a schematic plan view of a display device according to an embodiment of the present disclosure.

Reference will now be made in detail to embodiments of the disclosure examples of which are illustrated in the accompanying drawings.

As described above, there are several technical requirements for implementing a light emitting display device in which an LED element is used as a light emitting element of a unit pixel. First, LED elements are crystallized on a semiconductor wafer substrate such as sapphire or silicon (Si) and the plurality of crystallized LED chips are moved to a substrate having a driving element. A precise transferring process of positioning each of the LED chips at a position corresponding to each pixel is required.

The LED elements can be formed using an inorganic material, but since an inorganic material such as GaN must be crystallized, the inorganic material must be crystallized on a semiconductor substrate capable of efficiently inducing crystallization of the inorganic material.

A process of crystallizing the LED elements is also referred to as epitaxy, epitaxial growth, or an epitaxial process. The epitaxial process means a growth on a surface of a certain crystal by taking a specific orientation relationship. In order to form an element structure of the LED elements, a GaN compound semiconductor is stacked on the substrate in a form of a p-n junction diode, and each layer is grown by inheriting crystallinity of the underlying layer.

In this instance, since defects in the crystal act as nonradiative centers in the electron-hole recombination process, the crystallinity of the crystals forming each layer has a decisive influence on device efficiency in an LED device using a photon.

As a substrate mainly used at present, the above-described sapphire substrate is mainly used, and recently, research activities on substrates based on GaN have been actively performed.

As described above, because of a high price of a semiconductor substrate required for crystallizing an inorganic material such as GaN, which constitutes the LED light emitting element, on the semiconductor substrate, when a large amount of LEDs are used as a light emitting pixel of a display device other than an LED as a light source used for simple illumination or backlight, there is a problem that the manufacturing cost is increased.

In addition, as described above, a step of transferring the LED element formed on the semiconductor substrate into the substrate constituting the display device is required. In this process, it is difficult to separate the LED element from the semiconductor substrate. There may also be a great deal of difficulty in correctly transplanting the separated LED element to a desired spot.

On the other hand, unlike an organic light emitting display device, the display device using the LED element does not require a sealing film or a sealing substrate, so that a bezel area can be minimized and it is advantageous to construct a modular display device using a plurality of display devices.

In implementing the display device using the LED element having the advantages described above, there is a significant technical difficulty in correctly aligning the LED elements corresponding to each pixel in the step of transplanting the grown LED element into the substrate of the display device.

Since a distance between the pixels in the display device is much greater than a distance between the LED elements in the semiconductor substrate, the LED elements in the semiconductor substrate can not be directly transplanted one by one to the display device. A step of detaching the LED elements from the semiconductor substrate and transplanting the LED elements into the substrate of the display device is required in consideration of the distance between the pixels (pixel pitch).

In a step or process of transplanting the LED elements into the display device, when distances of the LED elements are not constant or balanced, an image displayed on the display device may be distorted and an image display quality of the display device may deteriorate.

In the step of transplanting the LED elements into the display device, since it is difficult to directly transplant the LED elements from the semiconductor substrate to the display substrate, a transfer substrate is used. Since a size of the semiconductor substrate is limited, the LED elements are transplanted using a plurality of transfer substrates on one display device.

At this time, while keeping the distance between the LED elements constant, in transplanting the LED elements to the substrate of the display device using the plurality of transfer substrates, there is a problem that the distance between the LED elements becomes different due to accumulated process errors or the like which may occur while using the plurality of transfer substrates.

It is an object of the present disclosure to provide a display device having improved display quality by maintaining a constant distance between LED elements in a display device having LED elements and a method of manufacturing the same.

In the following description, when it is determined that detailed description of known functions or configurations related to the present disclosure unnecessarily makes the gist of the present disclosure unclear, the detailed description thereof will be omitted. Advantages and features of the present disclosure and methods for accomplishing the same will become apparent with reference to embodiments described in detail below with reference to the accompanying drawings. However, the present disclosure is not limited to the embodiments disclosed below, and may be implemented in various forms. These embodiments are provided so that the present disclosure will be exhaustively and completely described, and will fully convey the scope of the present disclosure to those skilled in the art to which the present disclosure pertains. The present disclosure is defined by the scope of the claims.

Shapes, sizes, ratios, angles, number, and the like illustrated in the drawings for describing embodiments of the present disclosure are merely exemplary, and the present disclosure is not limited thereto. Like reference numerals designate like elements throughout the description. In the following description, when a detailed description of well-known functions or configurations related to this document is determined to unnecessarily cloud a gist of the invention, the detailed description thereof will be omitted. In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including an error range.

In the description of position relationship, when a structure is described as being positioned "on or above", "under or below", "next to" another structure, this description should be construed as including a case in which the structures contact each other as well as a case in which a third structure is disposed therebetween.

In a case of a description of a temporal relationship, for example, if the temporal order relationship is described by "after", "followed by", "next", "before", etc., it may also include a case where it is not continuous unless "right" or "direct" is used.

In a case of a description of a signal flow relationship, for example, even if a signal is transmitted from node A to node B, it may also include a case where the signal is transmitted from the node A to the node B via another node unless "right" or "direct" is used.

The terms "first", "second", etc. may be used to describe various components, but the components are not limited by such terms. These terms are only used to distinguish one component from another component. For example, a first element could be termed a second element, and, similarly, a second element could be termed a first element, without departing from the scope of the present disclosure.

The features of various embodiments of the present disclosure can be partially combined or entirely combined with each other, and is technically capable of various interlocking and driving. The embodiments can be independently implemented, or can be implemented in conjunction with each other.

Hereinafter, various configurations of a display device having an LED element according to an embodiment of the present disclosure will be described in detail with reference to the drawings.

Figure 2:
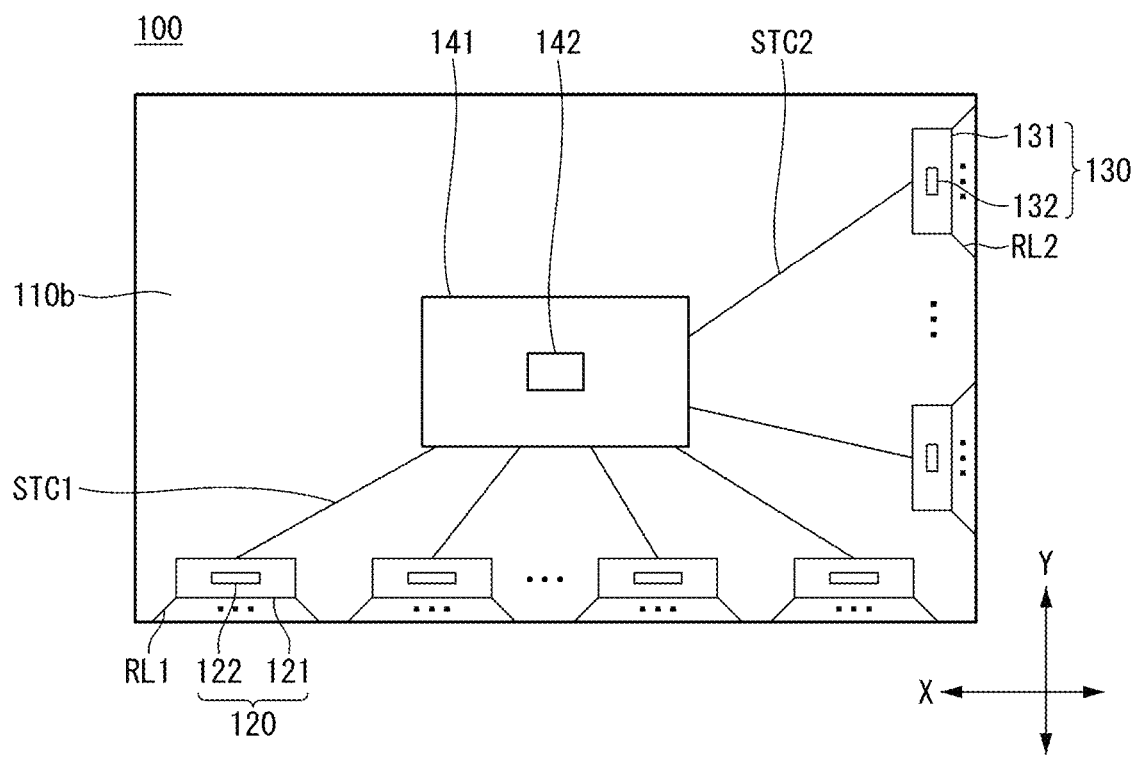
FIG. 2 is a plan view illustrating a rear surface of a display device shown in FIG. 1.
Figure 3:
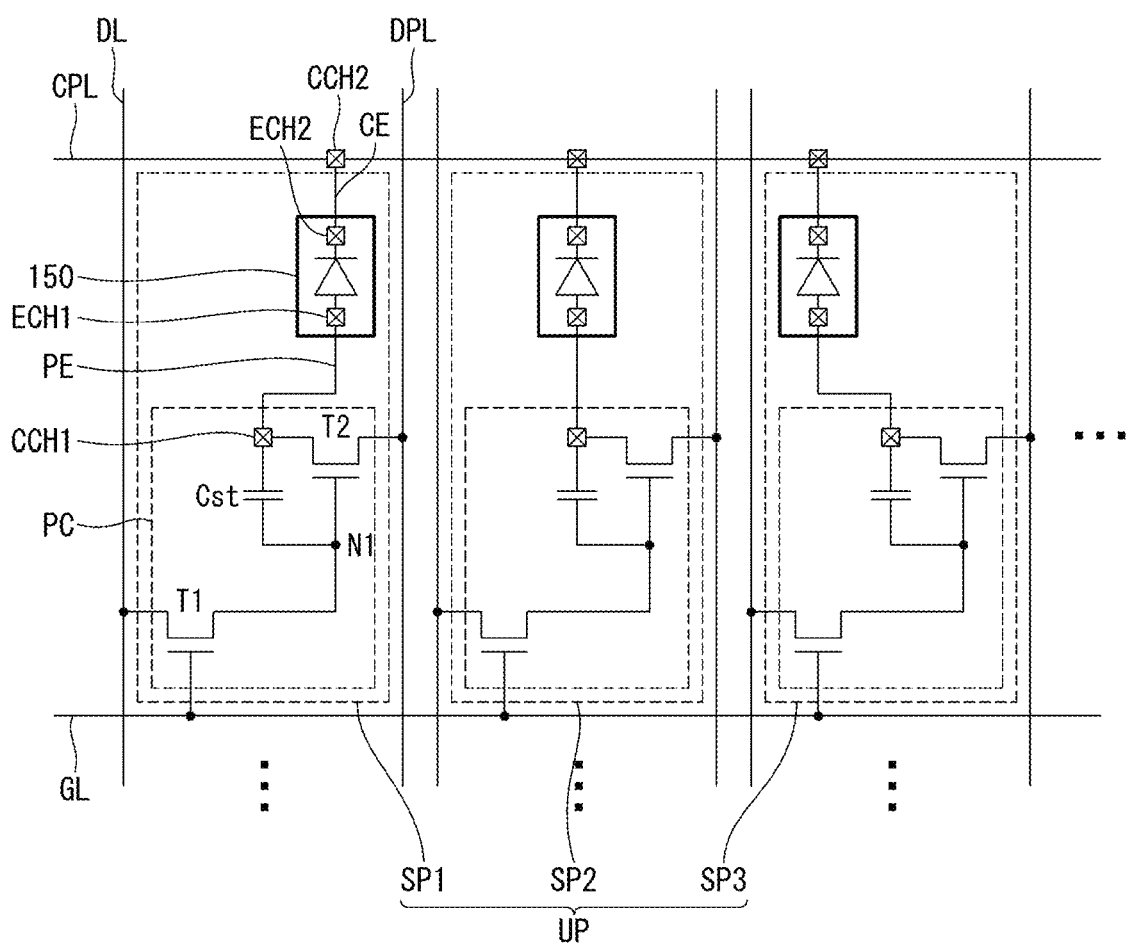
FIG. 3 is a schematic circuit diagram for explaining a configuration of a unit pixel according to an embodiment shown in FIG. 1.

FIG. 1 is a schematic plan view of a display device according to an embodiment of the present disclosure. FIG. 2 is a plan view illustrating a rear surface of a display device shown in FIG. 1. FIG. 3 is a schematic circuit diagram for explaining a configuration of a unit pixel according to an embodiment shown in FIG. 1. Referring to FIGS. 1 to 3, a display device 100 according to an embodiment of the present disclosure includes a substrate 110 in which a display area AA having a plurality of unit pixels UP and a non-display area IA are defined.

A unit pixel UP may be composed of a plurality of sub-pixels SP1, SP2, and SP3 on a front surface 110a of the substrate 110. The unit pixel UP may include the sub pixels SP1, SP2, and SP3 that emit light of red, blue, and green. However, the present disclosure is not limited thereto, and the unit pixel UP may include a sub pixel emitting light such as white.

The substrate 110 is a thin film transistor array substrate, and may be made of glass or plastic. The substrate 110 may be a laminated substrate of two or more substrates or a substrate divided into two or more layers. The non-display area IA may be defined as an area on the substrate 110 excluding the display area AA. The non-display area IA may have a relatively narrow width, and may be defined as a bezel area.

Each of the plurality of unit pixels UP is arranged in the display area AA. At this time, each of the plurality of unit pixels UP is arranged in the display area AA so as to have a first reference pixel pitch preset along an X-axis direction and a second reference pixel pitch preset along a Y-axis direction. The first reference pixel pitch may be defined as a distance between central portions of each of adjacent unit pixels UP in the X-axis direction. The second reference pixel pitch may be defined as a distance between central portions of each of adjacent unit pixels UP in the Y-axis direction similarly to the first reference pixel pitch.

Meanwhile, a distance between the sub-pixels SP1, SP2, and SP3 constituting the unit pixel UP may be defined as a first reference sub-pixel pitch and a second reference sub-pixel pitch similarly to the first reference pixel pitch and the second reference pixel pitch.

The display device 100 including a micro light emitting element 150, which is an LED element, may have a width of the non-display area IA smaller than the above-described reference pixel pitch or reference sub-pixel pitch. When a multi-screen display device is constituted by the display device 100 having the non-display area IA that has a width equal to or less than the reference pixel pitch or the reference sub-pixel pitch, the multi-screen display device having substantially no bezel area can be implemented since the non-display area IA is smaller than the reference pixel pitch or the reference sub-pixel pitch.

In order to implement the multi-screen display device in which the bezel area is substantially absent or minimized as described above, the display device 100 may keep the first reference pixel pitch, the second reference pixel pitch, the first reference sub-pixel pitch, and the second reference sub-pixel pitch constant in the display area AA. However, a size of the bezel area can be made relatively smaller than the pixel pitch by defining the display area AA as a plurality of areas, making the pitch lengths different from each other in the respective areas, and making a pixel pitch of an area adjacent to the non-display area IA wider than the other areas.

In this way, the display device 100 having different pixel pitches may cause distortion of images. Thus, the bezel area can be minimized while minimizing the distortion of images by performing image processing in such a manner that image data is sampled in comparison with an adjacent area in consideration of a set pixel pitch.

However an minimum area for a pad area for connection with a circuit part for transmitting and receiving power and data signals and a driver IC for driving, and the like is required in the unit pixel UP in which the micro light emitting element 150 is provided.

Referring to FIG. 2, the display device 100 may further include a plurality of first routing lines RL1, a plurality of second routing lines RL2, and a display driver such as a data driver 120, a gate driver 130, a control board 141 and a timing controller 142 on a rear surface 110*b* of the substrate 110.

The plurality of first routing lines RL1 are electrically connected to a plurality of pixel drive lines, more specifically, ends of each of a plurality of data lines DL, provided on the front surface 110*a* of the substrate 110, and disposed to extend from the non-display area IA of the substrate 110 to a side surface of the substrate 110 and the rear surface 110*b* of the substrate 110, so that the plurality of first routing lines RL1 are electrically connected to a plurality of data drivers 120.

That is, each of the plurality of first routing lines RL1 is provided so as to surround outside of a first side surface of the substrate 110. One end thereof is connected to the plurality of data lines DL in the non-display area IA of the substrate 110. Other end thereof is connected to a corresponding data driver 120 provided on the rear surface 110*b* of the substrate 110. Here, the non-display area IA of the substrate 110 may be a lower edge area of the substrate 110 shown in FIG. 1.

Each of a plurality of gate drivers 130 is provided at a constant distance on a second side rear surface edge of the substrate 110.

The plurality of second routing lines RL2 are electrically connected to a plurality of pixel drive lines, more specifically, ends of each of a plurality of gate lines GL, provided on the front surface 110*a* of the substrate 110, and disposed to extend from the non-display area IA of the substrate 110 to the side surface of the substrate 110 and the rear surface 110*b* of the substrate 110, so that the plurality of second routing lines RL2 are electrically connected to the plurality of gate drivers 130.

That is, each of the plurality of second routing lines RL2 is provided so as to surround outside of a second side surface of the substrate 110. One end thereof is connected to the plurality of gate lines GL in the non-display area IA of the substrate 110. Other end thereof is connected to a corresponding gate driver 130 provided on the rear surface 110*b* of the substrate 110. Here, the non-display area IA of the substrate 110 may be a right edge area of the substrate 110 shown in FIG. 1.

Each of the plurality of data drivers 120 includes a plurality of data flexible circuit films 121 and a plurality of data driver integrated circuits 122.

Each of the plurality of data flexible circuit films 121 may be attached to the rear face 110*b* of the substrate 110 by a film attaching process.

Although not provided with specific drawings, the data driver 120 and the gate driver 130 may be bonded to the substrate 110 in a form of being mounted on different substrates when the substrate 110 is composed of a plurality of substrates having two or more substrates. In this instance, as a result, the data driver 120 and the gate driver 130 may be directly mounted on the rear surface 110*b* of the substrate 110. Alternatively, the data driver 120 and the gate driver 130 may be directly mounted on the rear surface 110*b* on a single substrate instead of a plurality of substrates. Hereinafter, as shown in FIG. 2, a configuration in which the flexible circuit films 121 and 131 are used will be described.

Each of the plurality of data driver integrated circuits 122 is individually mounted on each of the plurality of data flexible circuit films 121. Each of the plurality of data driver integrated circuits 122 receives sub-pixel data and a data control signal provided from the timing controller 142, converts the sub-pixel data into an analog data voltage for each sub-pixel depending on the data control signal, and supplies the analog data voltage to a corresponding data lines DL.

Alternatively, each of the plurality of data driver integrated circuits 122 may be directly mounted on the rear surface 110*b* of the substrate 110 without being mounted on the data flexible circuit film 121. Here, each of the plurality of data driver integrated circuits 122 may be mounted on the rear surface 110*b* of the substrate 110 by a chip mounting process according to a chip on glass method. In this instance, the data flexible circuit film 121 can be eliminated, and a configuration of the data driver 120 can be simplified.

Each of the plurality of gate drivers 130 includes a plurality of gate flexible circuit films 131 and a plurality of gate driver integrated circuits 132.

Each of the plurality of gate flexible circuit films 131 is attached to the rear surface 110*b* of the substrate 110 by a film attaching process.

Each of the plurality of gate driver integrated circuits 132 is individually mounted on each of the plurality of gate flexible circuit films 131. Each of the plurality of gate driver integrated circuits 132 generates a scan pulse based on a gate control signal provided from the timing controller 142 and supplies the generated scan pulse to a gate line GL corresponding to a predetermined sequence.

Alternatively, each of the plurality of gate driver integrated circuits 132 may be directly mounted on the rear surface 110*b* of the substrate 110 without being mounted on the gate flexible circuit film 131. Here, each of the plurality of gate driver integrated circuits 132 may be mounted on the rear surface 110*b* of the substrate 110 by a chip mounting process according to a chip on glass method. In this instance, the gate flexible circuit films 131 can be eliminated, and a configuration of the gate driver 130 can be simplified.

The control board 141 is connected to each of the plurality of data flexible circuit films 121 and each of the plurality of gate flexible circuit films 131, respectively. For example, the control board 141 may be electrically connected to the plurality of data flexible circuit films 121 through a plurality of first signal transmission cables STC1, and the plurality of gate flexible circuit films 131 through a plurality of second signal transmission cables STC2. The control board 141 supports the timing controller 142 and serves to transmit signals and power between the configurations of the display driver.

The timing controller 142 is mounted on the control board 141, and receives image data and a timing synchronization signal provided from a display drive system through a user connector provided on the control board 141. The timing controller 142 generates sub-pixel data by aligning the image data so as to be suitable for the sub-pixel arrangement structure of the display area AA on the basis of the timing synchronization signal and provides the generated sub-pixel data to a corresponding data driver integrated circuit 122. The timing controller 142 generates the data control signal and the gate control signal on the basis of the timing synchronization signal, respectively, to control drive timings of the plurality of data driver integrated circuits 122 and the plurality of gate driver integrated circuits 132, respectively.

In addition, the plurality of data driver integrated circuits 122, the plurality of gate driver integrated circuits 132 and the timing controller 142 may be constituted by one integrated driver integrated circuit. In this instance, the one integrated driver integrated circuit is mounted on the rear surface 110*b* of the substrate 110. Each of the plurality of first routing lines RL1 and the plurality of second routing lines RL2 may be additionally routed to the rear surface 110*b* of the substrate 110 to be electrically connected to a corresponding channel provided in the integrated driver integrated circuit. In this instance, each of the plurality of data flexible circuit films 121 and the plurality of gate flexible circuit films 131 is omitted.

Additionally, in this example, each corner portion of the substrate 110 may be chamfered to have a constant angle or length, or rounded to have a constant curvature. Thus, the plurality of first routing lines RL1 and the plurality of second routing lines RL2 can be easily arranged on the corner portion and an outer side surface of the substrate 110 without disconnection.

Referring to FIG. 3, the configuration and circuit structure of the sub-pixels SP1, SP2, and SP3 constituting the unit pixel UP of the display device 100 will be described. The pixel drive lines are provided on the front surface 110*a* of the substrate 110 and supply signals necessary for each of the plurality of sub-pixels SP1, SP2 and SP3. The pixel drive lines according to an embodiment of the present disclosure include a plurality of gate lines GL, a plurality of data lines DL, a plurality of driving power supply lines DPL, and a plurality of common power supply lines CPL.

Each of the plurality of gate lines GL is provided on the front surface 110*a* of the substrate 110, and extended along a first horizontal axis direction X of the substrate 110 and is spaced a constant distance apart along a second horizontal axis direction Y.

Each of the plurality of data lines DL is provided on the front surface 110*a* of the substrate 110 so as to intersect with the plurality of gate lines GL, and extended along the second horizontal axis direction Y of the substrate 110 and is spaced a constant distance apart along the first horizontal axis direction X.

Each of the plurality of driving power supply lines DPL is provided on the substrate 110 so as to be parallel to each of the plurality of data lines DL and may be arranged together with each of the plurality of data lines DL. Each of the plurality of driving power supply lines DPL supplies a pixel driving power provided from outside to an adjacent sub-pixel SP.

Each of the plurality of common power supply lines CPL is provided on the substrate 110 so as to be parallel to each of the plurality of gate lines GL and may be arranged together with each of the plurality of gate lines GL. Each of the plurality of common power supply lines CPL supplies a common power provided from outside to adjacent sub-pixels SP1, SP2, and SP3.

Each of the plurality of sub-pixels SP1, SP2, and SP3 is provided in a sub-pixel area defined by the gate line GL and the data line DL. Each of the plurality of sub-pixels SP1, SP2, and SP3 may be defined as a minimum unit area in which actual light is emitted.

At least three sub-pixels SP1, SP2, and SP3 adjacent to each other may constitute one unit pixel UP for color display. For example, the one unit pixel UP may include a red sub-pixel SP1, a green sub-pixel SP2 and a blue sub-pixel SP3 adjacent to each other along the first horizontal axis direction X, and further include a white sub-pixel to improve luminance.

Alternatively, each of the plurality of driving power supply lines DPL may be provided for each of the plurality of unit pixels UP. In this instance, at least three sub-pixels SP1, SP2 and SP3 constituting each unit pixel UP share one driving power supply line DPL. Thus, the number of driving power supply lines for driving each of the sub-pixels SP1, SP2, and SP3 can be decreased. An aperture ratio of each unit pixel UP can be increased or a size of each unit pixel UP can be reduced by the decreased number of driving power supply lines.

Each of the plurality of sub-pixels SP1, SP2, and SP3 according to an embodiment of the present disclosure includes a pixel circuit PC and a micro light emitting element 150.

The pixel circuit PC is provided in a circuit area defined in each sub-pixel SP and is connected to adjacent gate line GL, data line DL, and driving power supply line DPL. The pixel circuit PC controls a current flowing to the micro light emitting element 150 depending on a data signal from the data line DL in response to the scan pulse from the gate line GL based on the pixel driving power provided from the driving power supply line DPL. The pixel circuit PC according to an embodiment of the present disclosure includes a switching thin film transistor T1, a driving thin film transistor T2, and a capacitor Cst.

The switching thin film transistor T1 includes a gate electrode connected to the gate line GL, a first electrode connected to the data line DL and a second electrode connected to a gate electrode N1 of the driving thin film transistor T2. The first and second electrodes of the switching thin film transistor T1 may be a source electrode or a drain electrode depending on a current direction. The switching thin film transistor T1 is switched depending on the scan pulse supplied to the gate line GL to supply the data signal supplied to the data line DL to the driving thin film transistor T2.

The driving thin film transistor T2 is turned on by a voltage supplied from the switching thin film transistor T1 and/or a voltage of the capacitor Cst, thereby controlling an amount of current flowing from the driving power supply line DPL to the micro light emitting element 150. The driving thin film transistor T2 according to an embodiment of the present disclosure includes a gate electrode connected to the second electrode N1 of the switching thin film transistor T1, a drain electrode connected to the driving power supply line DPL, and a source electrode connected to the micro light emitting element 150. This driving thin film transistor T2 controls a data current flowing from the driving power supply line DPL to the micro light emitting element 150 based on a data signal supplied from the switching thin film transistor T1, thereby controlling light emission of the micro light emitting element 150.

The capacitor Cst is provided in an overlapping area between the gate electrode N1 and the source electrode of the driving thin film transistor T2, stores a voltage corresponding to the data signal supplied to the gate electrode of the driving thin film transistor T2, and turns on the driving thin film transistor T2 with the stored voltage.

Alternatively, the pixel circuit PC may further include at least one compensating thin film transistor for compensating for a change in threshold voltage of the driving thin film transistor T2, and further include at least one auxiliary capacitor. This pixel circuit PC may be further supplied with a compensation power such as an initialization voltage depending on the number of the thin film transistors and the auxiliary capacitors. Therefore, the pixel circuit PC according to an embodiment of the present disclosure can be changed to a pixel circuit of a known organic light emitting display device since it drives the micro light emitting element 150 through a current driving method like each sub pixel of the organic light emitting display device.

The micro light emitting element 150 is mounted on each of the plurality of sub-pixels SP1, SP2, and SP3. The micro light emitting element 150 is electrically connected to the pixel circuit PC of the corresponding sub-pixel SP and the common power supply line CPL, thereby being emitted by a current flowing to the pixel circuit PC, that is, a current flowing from the driving thin film transistor T2 to the common power supply line CPL. The micro light emitting element 150 according to an embodiment of the present disclosure may be a micro light emitting element or a micro light emitting diode chip that emits one of red light, green light, blue light, and white light. Here, the micro light emitting diode chip may have a scale of 1 to 100 micrometers, but is not limited thereto. The micro light emitting diode chip may have a size smaller than a size of a remaining light emitting area except a circuit area occupied by the pixel circuit PC in the sub pixel area.

Figure 4:
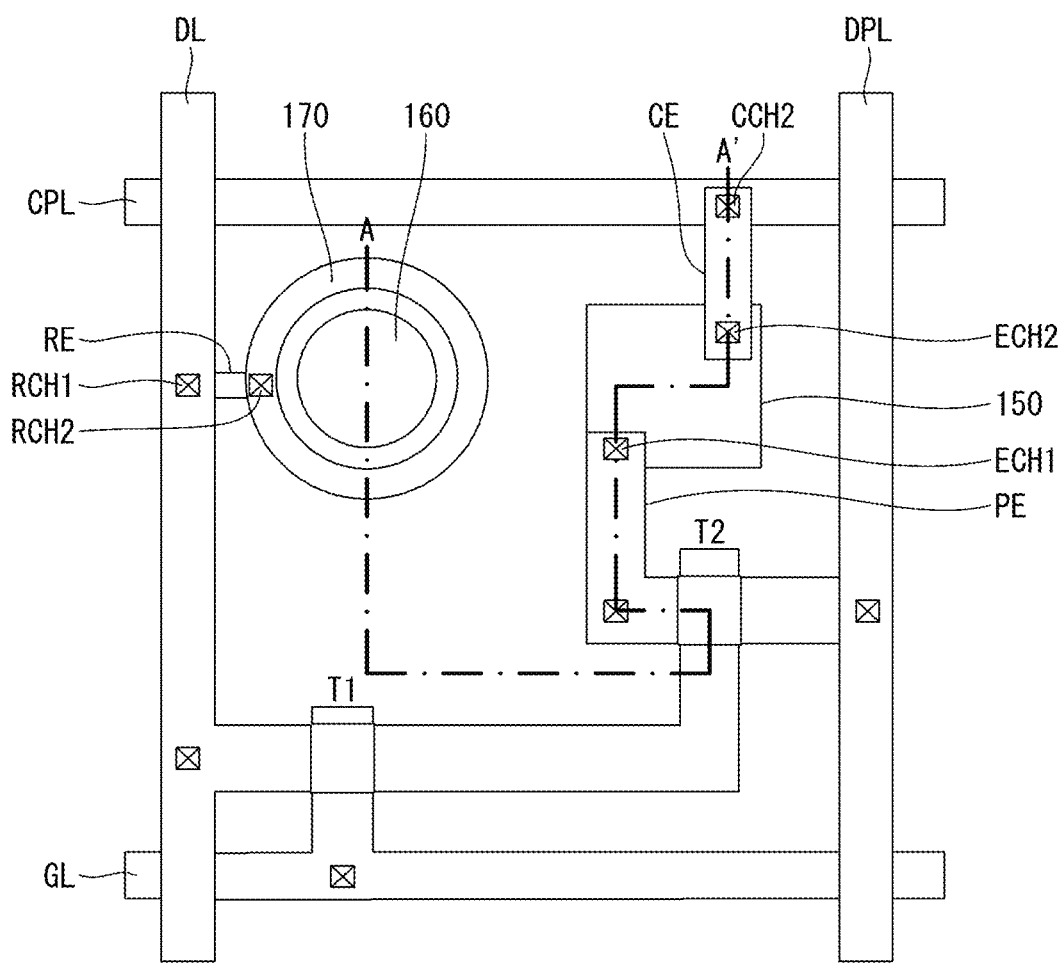
FIG. 4 is a schematic plan view of a display device having a light emitting chip and a structure.
Figure 5:
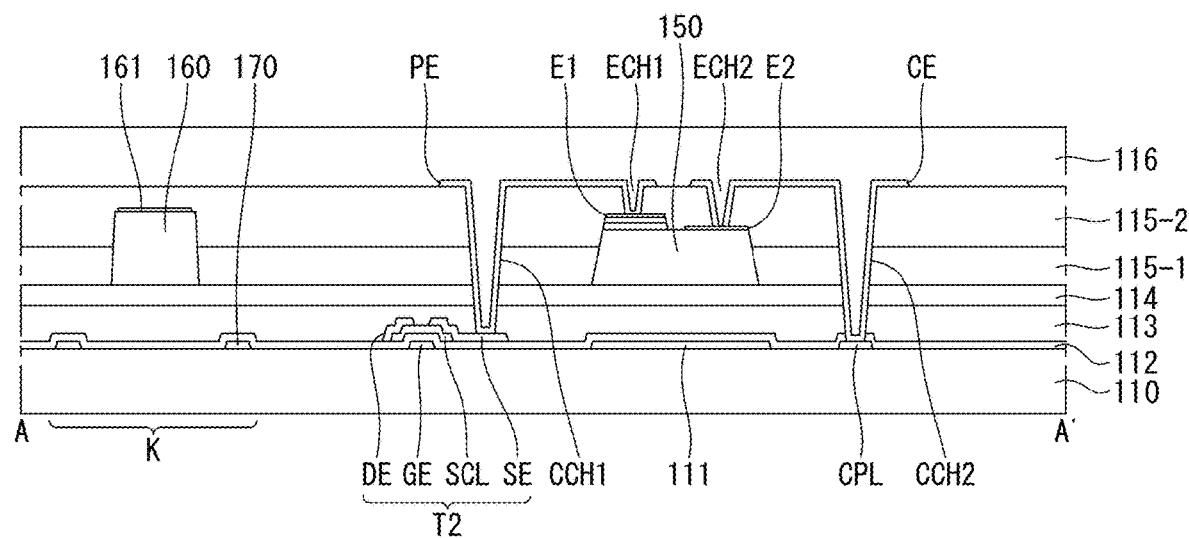
FIG. 5 is a schematic cross-sectional view of a line A-A' shown in FIG. 4.
Figure 6:
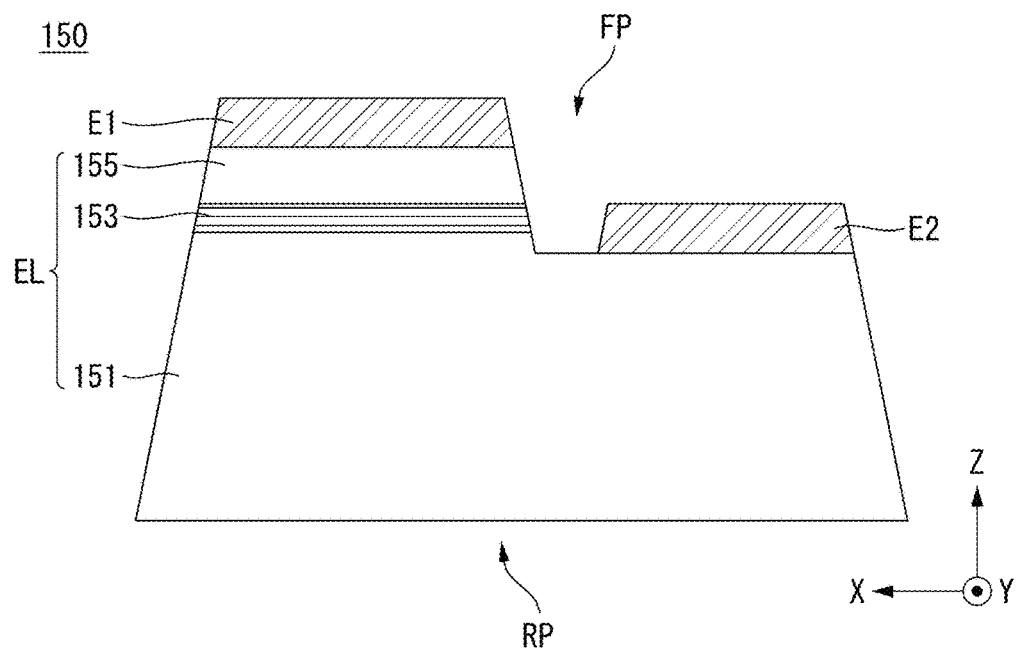
FIG. 6 is a schematic cross-sectional view for explaining a structure of a micro light emitting element shown in FIG. 4.

FIG. 4 is a schematic plan view of a display device having a light emitting chip and a structure. FIG. 5 is a schematic cross-sectional view of a line A-A' shown in FIG. 4. FIG. 6 is a schematic cross-sectional view for explaining a structure of a micro light emitting element shown in FIG. 4.

Referring to FIGS. 4, 5, and 6, the description will be made with reference to FIGS. 1 to 3. Each of sub-pixels SP1, SP2 and SP3 of a display device according to an embodiment of the present disclosure includes a passivation layer 113, a micro light emitting element 150, planarization layers 115-1 and 115-2, a pixel electrode PE, and a common electrode CE.

First, although a thickness of a substrate 110 is relatively thin in FIG. 5, substantially the thickness of the substrate 110 may be much thicker than an overall thickness of a layer structure provided on the substrate 110. The substrate 110 may be composed of a plurality of layers or may be a substrate on which a plurality of substrates are bonded.

The pixel circuit PC includes the switching thin film transistor T1, the driving thin film transistor T2, and the capacitor C. Since the pixel circuit PC is the same as that described above, a detailed description thereof will be omitted. Hereinafter, the structure of the driving thin film transistor T2 will be described with examples.

The driving thin film transistor T2 includes a gate electrode GE, a semiconductor layer SCL, a source electrode SE, and a drain electrode DE.

The gate electrode GE is disposed on the substrate 110 together with the gate line GL. This gate electrode GE is covered by a gate insulating layer 112. The gate insulating layer 112 may be a single layer or a plurality of layers made of an inorganic material, and may be formed of silicon oxide (SiOx), silicon nitride (SiNx), or the like.

The semiconductor layer SCL is provided in a form of a pattern (or island) previously set on the gate insulating layer 112 so as to overlap with the gate electrode GE. The semiconductor layer SCL may be formed of a semiconductor material composed of any one of amorphous silicon, polycrystalline silicon, oxide, and organic material, but is not limited thereto.

The source electrode SE is disposed to overlap with one side of the semiconductor layer SCL. The source electrode SE is disposed together with the data line DL and the driving power supply line DPL.

The drain electrode DE is disposed so as to be spaced apart from the source electrode SE while overlapping with the other side of the semiconductor layer SCL. The drain electrode DE is disposed together with the source electrode SE and branches or protrudes from adjacent driving power supply line DPL.

In addition, the switching thin film transistor T1 constituting the pixel circuit PC is disposed as the same structure as the driving thin film transistor T2. A gate electrode of the switching thin film transistor T1 branches or protrudes from the gate line GL. A first electrode of the switching thin film transistor T1 branches or protrudes from the data line DL. A second electrode of the switching thin film transistor T1 is connected to the gate electrode GE of the driving thin film transistor T2 through a via hole provided in the gate insulating layer 112.

The passivation layer 113 is provided over an entire surface of the substrate 110 so as to cover the sub-pixel SP, that is, the pixel circuit PC. The passivation layer 113 protects the pixel circuit PC and provides a flat surface. The passivation layer 113 according to an embodiment of the present disclosure may be made of an organic material such as benzocyclobutene or photoacryl. However, the passivation layer 113 is preferably made of a photo-acrylic material for convenience of processing.

The micro light emitting element 150 according to an embodiment of the present disclosure may be disposed by using an adhesive member 114 on the passivation layer 113. Alternatively, the micro light emitting element 150 may be disposed in a concave portion provided on the passivation layer 113. An inclined surface due to the concave portion in the passivation layer 113 can advance the light emitted from the micro light emitting element 150 forward.

The micro light emitting element 150 is electrically connected to the pixel circuit PC and the common power line CPL, so that the micro light emitting element 150 emits light by a current flowing through the pixel circuit PC, that is, a current flowing from the driving thin film transistor T2 to the common power supply line CPL. The micro light emitting element 150 according to an embodiment of the present disclosure includes a light emitting layer EL, a first electrode (or an anode terminal) E1, and a second electrode (or a cathode terminal) E2.

The light emitting layer EL emits light by recombination of electrons and holes depending on a current flowing between the first electrode E1 and the second electrode E2. The light emitting layer EL according to an embodiment of the present disclosure includes a first semiconductor layer 151, an active layer 153, and a second semiconductor layer 155.

The first semiconductor layer 151 supplies electrons to the active layer 153. The first semiconductor layer 151 according to an embodiment of the present disclosure may be made of an n-GaN-based semiconductor material, and the n-GaN-based semiconductor material may be GaN, AlGaN, InGaN, or AlInGaN, or the like. Here, Si, Ge, Se, Te, C, or the like may be used as an impurity used for doping the first semiconductor layer 151.

The active layer 153 is provided on one side of the first semiconductor layer 151. The active layer 153 has a multi quantum well (MQW) structure having a well layer and a barrier layer having a higher band gap than the well layer. The active layer 153 according to an embodiment of the present disclosure may have a multiple quantum well structure such as InGaN/GaN.

The second semiconductor layer 155 is provided on the active layer 153 to supply holes to the active layer 153. The second semiconductor layer 155 according to an embodiment of the present disclosure may be made of a p-GaN-based semiconductor material, and the p-GaN-based semiconductor material may be GaN, AlGaN, InGaN, AlInGaN, or the like. Here, Mg, Zn, Be, or the like may be used as an impurity used for doping the second semiconductor layer 155.

The first electrode E1 is provided on the second semiconductor layer 155. The first electrode E1 is connected to the source electrode SE of the driving thin film transistor T2.

The second electrode E2 is provided on other side of the first semiconductor layer 151 so as to be electrically separated from the active layer 153 and the second semiconductor layer 155. The second electrode E2 is connected to the common power line CPL.

Each of the first and second electrodes E1 and E2 according to an embodiment of the present disclosure may be made of a material including at least one of a metal material such as Au, W, Pt, Si, Ir, Ag, Cu, Ni, Ti or Cr and an alloy thereof. Each of the first and second electrodes E1 and E2 according to another embodiment of the present disclosure may be made of a transparent conductive material. The transparent conductive material may be indium tin oxide (ITO), indium zinc oxide (IZO), or the like, but is not limited thereto.

In addition, the first semiconductor layer 151, the active layer 153, and the second semiconductor layer 155 may be sequentially stacked on a semiconductor substrate. Here, the semiconductor substrate includes a semiconductor material such as a sapphire substrate or a silicon substrate. The semiconductor substrate may be used as a growth substrate for growing the first semiconductor layer 151, the active layer 153, and the second semiconductor layer 155, and then separated from the first semiconductor layer 151 by a substrate separation process. The substrate separation process may be a laser lift off or a chemical lift off. Accordingly, as the semiconductor substrate for growth is removed from the micro light emitting element 150, the micro light emitting element 150 may have a relatively thin thickness, and can be accommodated in each sub-pixel SP.

As described above, the micro light emitting element 150 emits light by recombination of electrons and holes depending on the current flowing between the first electrode E1 and the second electrode E2.

The micro light emitting element 150 includes a first portion (or a front portion) FP having the first and second electrodes E1 and E2 connected to the pixel circuit PC, and a second portion (or a rear portion) RP opposite the first portion FP. Here, the first portion FP may have a smaller size than the second portion RP. In this instance, the micro light emitting element 150 may have a trapezoidal cross section having an upper base corresponding to the first portion FP and a lower base corresponding to the second portion RP.

On the other hand, a structure 160 is disposed apart from the micro light emitting element 150. The structure 160 may be a structure 160 made of the same material as the micro light emitting element 150. The structure 160 may be made of an n-GaN-based semiconductor material, and the n-GaN-based semiconductor material may be GaN, AlGaN, InGaN, AlInGaN, or the like. In addition, the structure 160 may include a layer doped with an impurity such as Mg, Zn, Be, or the like.

However, according to the above description, the display device may use a plurality of micro light emitting elements 150 and color filters, which are made of the same base material. A different micro light emitting element 150 capable of emitting green, blue, and red light may be disposed. In this instance, the structure 160 made of different base materials may be disposed on the display device.

When different micro light emitting elements 150 capable of emitting green, blue, and red light are disposed on the display device, the structure 160 may be a structure 160 made of the same base material as a light emitting chip selected from the different light emitting chips.

One side of the structure 160 may be surface treated with a material selected from materials such as Cr, Al, Au and Ag on a surface 161 of the structure 160 so that visibility is high. On the other hand, a second structure 170 may be disposed on the substrate 110 to correspond to the structure 160. The second structure 170 may be disposed with the same material as the gate electrode GE and may be a closed loop shape. Various shapes of the structure 160 and the second structure 170 will be described later.

The structure 160 is disposed between two adjacent pixels in the display device. Also, the structure 160 may be disposed at a certain distance from the micro light emitting element 150 because the structure 160 can be used as an alignment key in the process of disposing the micro light emitting element 150.

Since the structure 160 and the second structure 170 can be used as an alignment key, the structure 160 and the second structure 170 can be disposed at positions corresponding to each other. A central axis of the second structure 170 and a central axis of the structure 160 may be aligned so as to correspond to each other.

The arrangement in which the central axes of the structure 160 and the second structure 170 are aligned to be arranged so as to correspond to each other, in other words, means that the second structure 170 is arranged to surround the structure 160, when a distance from an inside of the second structure 170 to the structure 160 is considered, the structure 160 corresponding to the second structure 170 can be equally spaced vertically and horizontally.

The alignment relationship between the structure 160 and the second structure 170 is important in a problem of disposing the micro light emitting element 150 in a correct position. Since the micro light emitting element 150 and the structure 160 are transplanted together from the same semiconductor substrate to the substrate 110, if the distance between the structure 160 and the second structure 170 is kept constant, it is possible to reduce a process error when the micro light emitting element 150 is disposed at a designated position on the substrate 110. More details on this will be described in detail later in a description of the manufacturing method of the display device.

Since the second structure 170 is used in the alignment process of the micro light emitting element 150 using the structure 160 as described above, it is preferable that the second structure 170 is disposed with a material that can be easily recognized by a camera. If necessary, a camera recognition rate can be increased through a surface treatment.

The second structure 170 may be disposed with the same material as the gate electrode GE. However, the second structure 170 may be disposed with the same material as the electrode selected from the electrodes constituting the data line DL or the driving thin film transistor T2, depending on the convenience of the manufacturing process.

The second structure 170 may be electrically connected through the data line DL and a ground electrode RE. The second structure 170 may be electrically connected through a first ground contact hole RCH1 on the data line DL and the gate insulating layer 112 and a second ground contact hole RCH2 to prevent itself from floating on the substrate. At this time, it is preferable that a transparent electrode having low visibility is used as the ground electrode RE.

The planarization layers 115-1 and 115-2 are provided on the passivation layer 113 to cover the micro light emitting element 150 and the structure 160. That is, the planarization layers 115-1 and 115-2 are provided on the passivation layer 113 so as to have a thickness enough to cover a front surface of the passivation layer 113, a place where the micro light emitting element 150 and the structure 160 are disposed, and the rest of the front surface.

The planarization layers 115-1 and 115-2 may be formed of one layer. As shown, the planarization layers 115-1 and 115-2 may be planarization layers 115-1 and 115-2 having a multi-layer structure including a first planarization layer 115-1 and a second planarization layer 115-2.

As such, the planarization layers 115-1 and 115-2 provide a flat surface on the passivation layer 113. The planarization layers 115-1 and 115-2 serve to fix positions of the micro light emitting element 150 and the structure 160.

The pixel electrode PE connects the first electrode E1 of the micro light emitting element 150 to the source electrode SE of the driving thin film transistor T2 and may be defined as an anode electrode. The pixel electrode PE according to an embodiment of the present disclosure is provided on a front surface of the planarization layers 115-1 and 115-2 overlapping with the first electrode E1 of the micro light emitting element 150 and the driving thin film transistor T2. The pixel electrode PE is electrically connected to the source electrode SE of the driving thin film transistor T2 through a first circuit contact hole CCH1 provided through the passivation layer 113 and the planarization layers 115-1 and 115-2. The pixel electrode PE is electrically connected to the first electrode E1 of the micro light emitting element 150 through a first electrode contact hole ECH1 provided in the planarization layers 115-1 and 115-2. The first electrode E1 of the micro light emitting element 150 is electrically connected to the source electrode SE of the driving thin film transistor T2 through the pixel electrode PE. The pixel electrode PE may be formed of a transparent conductive material when the light emitting diode display device is a top emission type and may be formed of a reflective conductive material when the light emitting diode display device is a bottom emission type. Here, the transparent conductive material may be indium tin oxide (ITO), indium zinc oxide (IZO), or the like, but is not limited thereto. The reflective conductive material may be Al, Ag, Au, Pt, Cu, or the like, but is not limited thereto. The pixel electrode PE made of the reflective conductive material may be formed of a single layer including the reflective conductive material or a multi-layer in which the single layer is stacked.

The common electrode CE electrically connects the second electrode E2 of the micro light emitting element 150 to the common power supply line CPL and may be defined as a cathode electrode. The common electrode CE is provided on a front surface of the planarization layers 115-1 and 115-2 overlapping with the common power line CPL while overlapping with the second electrode E2 of the micro light emitting element 150. Here, the common electrode CE may be made of the same material as the pixel electrode PE.

One side of the common electrode CE according to an embodiment of the present disclosure is electrically connected to the common power supply line CPL through a second circuit contact hole CCH2 provided through the gate insulating layer 112, the passivation layer 113, and the planarization layers 115-1 and 115-2 overlapping with the common power line CPL. Other side of the common electrode CE according to an embodiment of the present disclosure is electrically connected to the second electrode E2 of the micro light emitting element 150 through a second electrode contact hole ECH2 provided in the planarization layers 115-1 and 115-2 so as to overlap with the second electrode E2 of the micro light emitting element 150. Accordingly, the second electrode E2 of the micro light emitting element 150 is electrically connected to the common power supply line CPL through the common electrode CE.

The pixel electrode PE and the common electrode CE according to an embodiment of the present disclosure may be formed on the planarization layers 115-1 and 115-2 including the first and second circuit contact holes CCH1 and CCH2 and the first and second electrode contact holes ECH1 and ECH2 at the same time by a deposition process for depositing an electrode material and an electrode patterning process using a photolithography process and an etching process. Accordingly, since one embodiment of the present disclosure can simultaneously arrange the pixel electrode PE connecting the micro light emitting element 150 to the pixel circuit PC and the common electrode CE, the electrode connecting process can be simplified, and the process time for connecting the micro light emitting element 150 and the pixel circuit PC can be greatly shortened. Accordingly, it possible to improve productivity of the light emitting diode display device.

According to an embodiment of the present disclosure, the light emitting diode display device further includes a transparent buffer layer 116.

The transparent buffer layer 116 is provided on the substrate 110 so as to cover all the planarization layers 115-1 and 115-2 provided with the pixel electrode PE and the common electrode CE, so that the transparent buffer layer 116 provides a flat surface on the planarization layers 115-1 and 115-2 and protects the micro light emitting element 150 and the pixel circuit PC from external impact. Accordingly, the pixel electrode PE and the common electrode CE are provided between the planarization layers 115-1 and 115-2 and the transparent buffer layer 116, respectively. The transparent buffer layer 116 according to an embodiment of the present disclosure may be an optical clear adhesive (OCA) or an optical clear resin (OCR), but is not limited thereto.

The light emitting diode display device according to an embodiment of the present disclosure further includes a reflective layer 111 provided below a light emitting area of each sub-pixel SP.

The reflective layer 111 is provided on the substrate 110 so as to overlap with the light emitting area including the micro light emitting element 150. The reflective layer 111 according to an embodiment of the present disclosure may be formed of the same material as the gate electrode GE of the driving thin film transistor T2 and may be provided in the same layer as the gate electrode GE, but is not limited thereto. The reflective layer 111 may be formed of the same material as any one of the electrodes constituting the driving thin film transistor T2.

The reflective layer 111 reflects light incident from the micro light emitting element 150 toward the first portion FP of the micro light emitting element 150. Accordingly, the light emitting diode display device according to an embodiment of the present disclosure has a top emission structure including the reflective layer 111. However, when the light emitting diode display device according to an embodiment of the present disclosure has a bottom emission structure, the reflective layer 111 may be omitted or may be disposed on top of the micro light emitting element 150.

Alternatively, the reflective layer 111 may be formed of the same material as the source/drain electrode SE/DE of the driving thin film transistor T2 and may be provided on the same layer as the source/drain electrode SE/DE.

In the light emitting diode display device according to an embodiment of the present disclosure, the micro light emitting element 150 mounted on each sub-pixel SP may be disposed at a position corresponding to an upper portion of the reflective layer 111 by the adhesive member 114.

The adhesive member 114 is interposed between the concave portion of each sub-pixel SP and the micro light emitting element 150 to attach the micro light emitting element 150 to the bottom surface of the concave portion, so that the adhesive member 114 primarily fixes the micro light emitting element 150.

The adhesive member 114 according to an embodiment of the present disclosure is in contact with the second portion RP of the micro light emitting element 150, that is, a rear surface of the first semiconductor layer 151, and prevents the position of the micro light emitting element 150 from being changed during a mounting process and at the same time allows the micro light emitting element 150 to be smoothly detached from an intermediate substrate used for the transplanting, so that the adhesive member 114 can minimize a defect of the transplanting process of the micro light emitting element 150.

The adhesive member 114 according to an embodiment of the present disclosure is dotted on each sub-pixel SP and spreads by a pressing force applied during the mounting process of the micro light emitting element 150, so that the adhesive member 114 may adhere to the second portion RP of the micro light emitting element 150. Accordingly, the micro light emitting element 150 can be primarily fixed in position by the adhesive member 114. Therefore, according to the present embodiment, the mounting process of the micro light emitting element is performed by simply bonding the micro light emitting element 150 to a surface, so that the mounting process time of the micro light emitting element can be greatly shortened.

The adhesive member 114 also allows the structure 160 to be aligned with the second structure 170 and disposed on the passivation layer 113. That is, the adhesive member 114 is provided to cover an entire remaining surface of a front surface of the passivation layer 113 except for the contact holes, so that the micro light emitting element 150 and the structure 160 are disposed on the passivation layer 113.

In other words, the adhesive member 114 is interposed between the passivation layer 113 and the planarization layers 115-1 and 115-2, and interposed between the micro light emitting element 150 and structure 160 and the passivation layer 113. The adhesive member 114 according to another example is coated with a constant thickness on an entire surface of the passivation layer 113 and a part of the adhesive member 114 coated on the entire surface of the passivation layer 113 is removed in a forming of the contact holes. Accordingly, in one embodiment of the present disclosure, the adhesive member 114 is coated with a constant thickness on the entire front surface of the passivation layer 113 immediately before the process of mounting the micro light emitting element 150, thereby shortening the process time for disposing the adhesive member 114.

In one embodiment of the present disclosure, the planarizing layers 115-1 and 115-2 are provided to cover the adhesive member 114 because the adhesive member 114 is provided on the entire front surface of the passivation layer 113.

In another embodiment of the present disclosure, below of the adhesive member 114, a concave portion for accommodating the micro light emitting element 150 separately may be disposed, and the micro light emitting element 150 can be positioned through the adhesive member 114 inside the concave portion. However, the concave portion for accommodating the above-described micro light emitting element 150 may be eliminated depending on various process conditions for implementing the display device.

The mounting process of the micro light emitting element according to an embodiment of the present disclosure may include a process of mounting a red micro light emitting element on each of the red sub-pixels SP1, a process of mounting a green micro light emitting element on each of the green sub-pixels SP2, and a process of mounting a blue micro light emitting element on each of the blue sub-pixels SP3, and may further include a process of mounting a white micro light emitting element on each of the white sub-pixels.

The mounting process of the micro light emitting element according to an embodiment of the present disclosure may include only a process of mounting the white micro light emitting element on each of the sub-pixels. In this instance, the substrate 110 includes a color filter layer overlapping with each sub-pixel. The color filter layer transmits only light having a wavelength of a color corresponding to the sub-pixel among white light.

The mounting process of the micro light emitting element according to an embodiment of the present disclosure may include only a process of mounting a micro light emitting element of a first color on each of the sub-pixels. In this instance, the substrate 110 includes a wavelength conversion layer and a color filter layer overlapping with each sub-pixel. The wavelength conversion layer emits light of a second color based on a part of the light of the first color incident from the micro light emitting element. The color filter layer transmits only light having a wavelength of a color corresponding to the sub-pixel among white light resulting from mixing of the light of the first color and the light of the second color. Here, the first color may be blue and the second color may be yellow. The wavelength conversion layer may include a fluorescent substance or a quantum dot particle that emits the light of the second color based on a part of the light of the first color.

Figure 7:
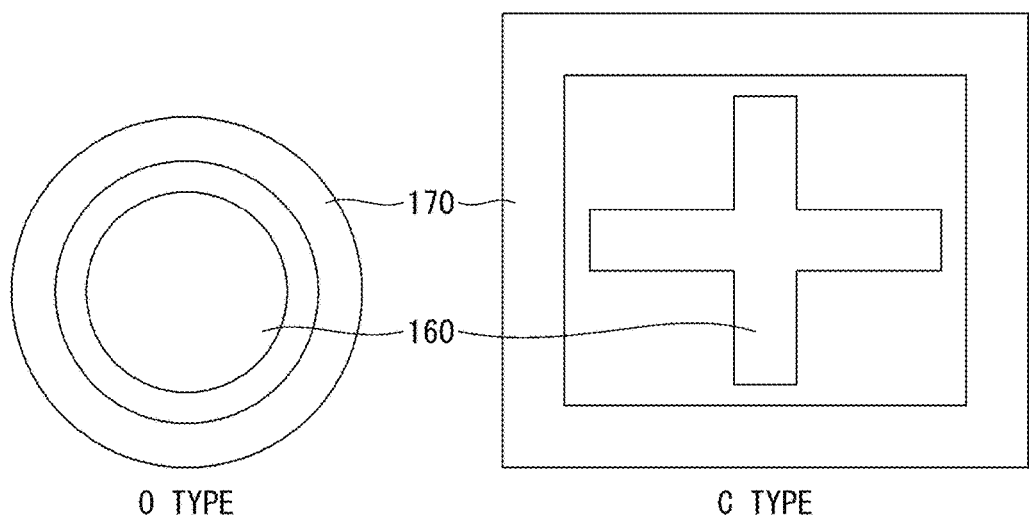
FIG. 7 is a view of various forms of structures used as alignment keys in K area shown in FIG. 5 according to an embodiment of the present disclosure.

FIG. 7 is a view of various forms of structures used as alignment keys in K area shown in FIG. 5 according to an embodiment of the present disclosure.

Referring to FIG. 7, a structure 160 and a second structure 170 may be arranged in various shapes and forms. In an instance of O type, which is a representative form, the structure 160 and the second structure 170 each may have the shape of a circle or an ellipse. Sizes of the structure 160 and the second structure 170 and a distance between the structure 160 and the second structure 170 may be varied to be used in order to reduce a process error of the alignment.

In addition, another type may have a polygonal shape like C type, in the relationship between the structure 160 and the second structure 170, a central line of each of the structure 160 and the second structure 170 may preferably coincide or face each other.

Figure 8A:
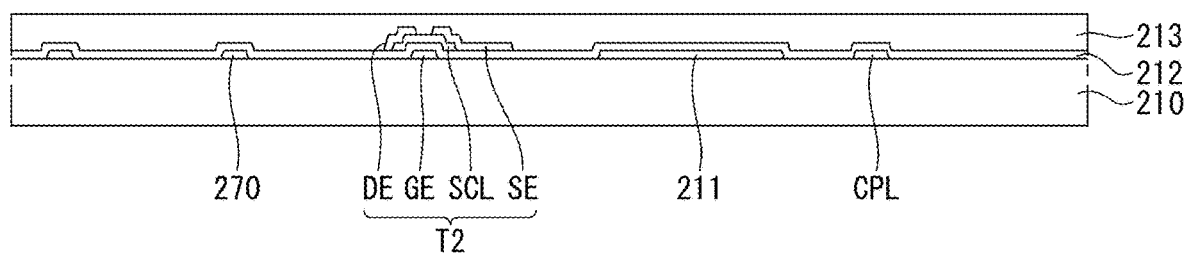
FIGS. 8A to 8C are schematic cross-sectional views illustrating a manufacturing process of a display device according to an embodiment of the present disclosure.
Figure 8B:
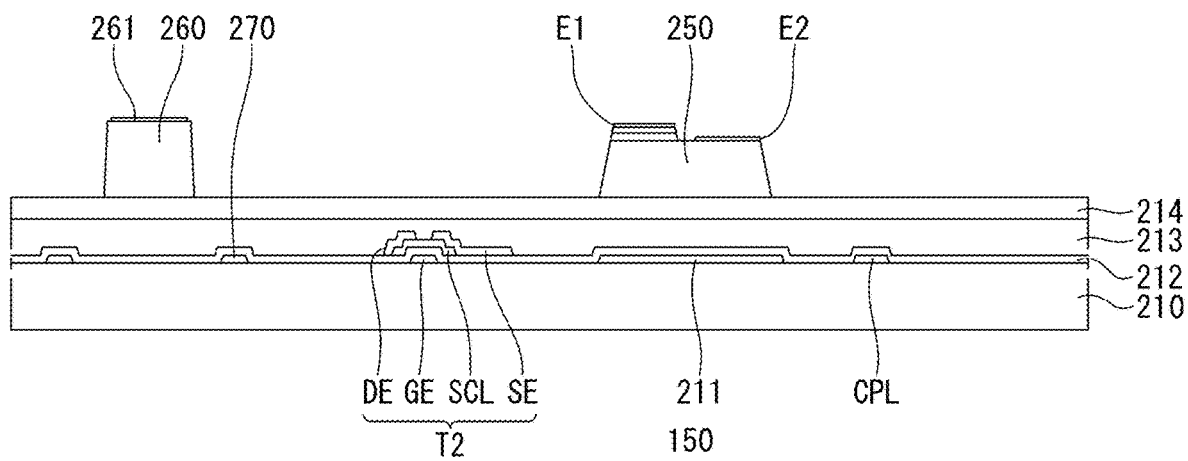
Figure 8C:
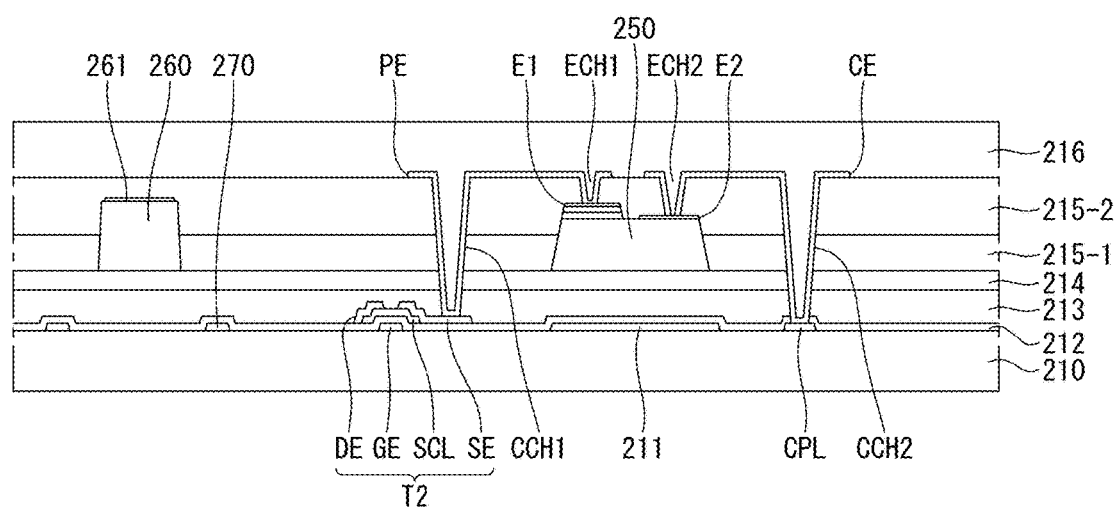

FIGS. 8A to 8C are schematic cross-sectional views illustrating a manufacturing process of a display device according to an embodiment of the present disclosure.

Hereinafter, a manufacturing process of a display device will be described with reference to FIGS. 8A to 8C, and overlapping description of each component will be omitted.

A substrate 210 with at least one thin film transistor T2 is provided. A reflective layer 211 and a second structure 270 are disposed on the substrate 210 and a gate insulating layer 212 and a passivation layer 213 are disposed. The second structure 270 may be disposed with the same material as an electrode selected from electrodes constituting the thin film transistor T2.

Next, a structure 260 and a micro light emitting element 250 are disposed on the passivation layer 213. An adhesive member 214 is disposed on the passivation layer 213 to dispose the structure 260 and the micro light emitting element 250 on the passivation layer 213. The adhesive member 214 is in contact with a lower portion of the structure 260 and the micro light emitting element 250 to adhere to the passivation layer 213.

In the process of disposing the structure 260 and the micro light emitting element 250, the structure 260 may be used as an alignment key in a process of aligning the micro light emitting element 250 so that the micro light emitting element 250 can be correctly positioned on the reflective layer 211. When the structure 260 is disposed with the second structure 270 as a reference key, it is possible to precisely adjust a position where the micro light emitting element 250 to be disposed together is arranged. A process of transplanting the structure 260 and the micro light emitting element 250 together will be described later.

After that, planarization layers 215-1 and 215-2 are disposed to cover the structure 260 and the micro light emitting element 250. The planarization layers 215-1 and 215-2 may be composed of at least one layer, and arrange electrodes so that electrodes of the micro light emitting element 250 and the thin film transistor T2 or a power supply line are connected through a plurality of contact holes.

Figure 9A:
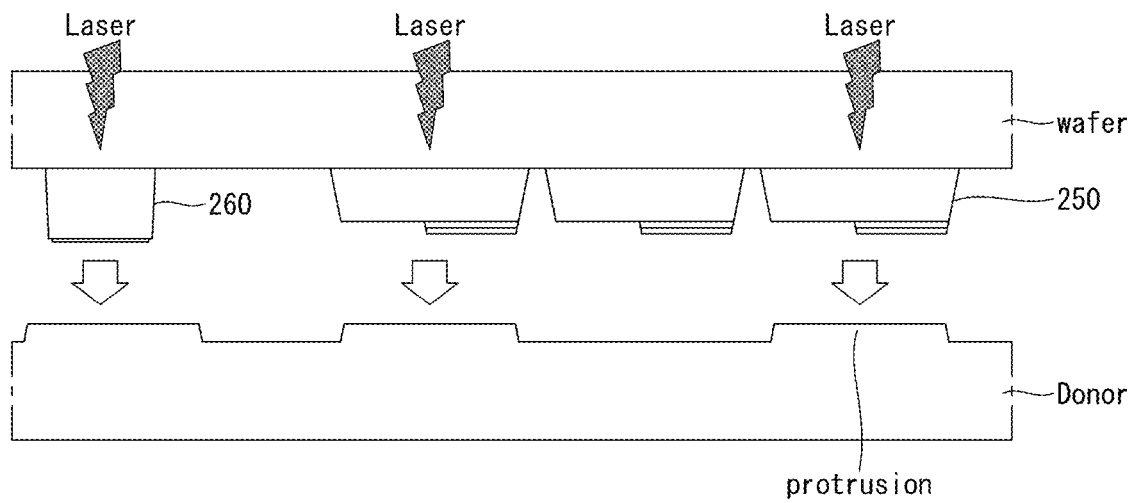
FIGS. 9A and 9B are schematic cross-sectional views illustrating a process of transplanting a light emitting chip and a structure mounted on a display device.
Figure 9B:
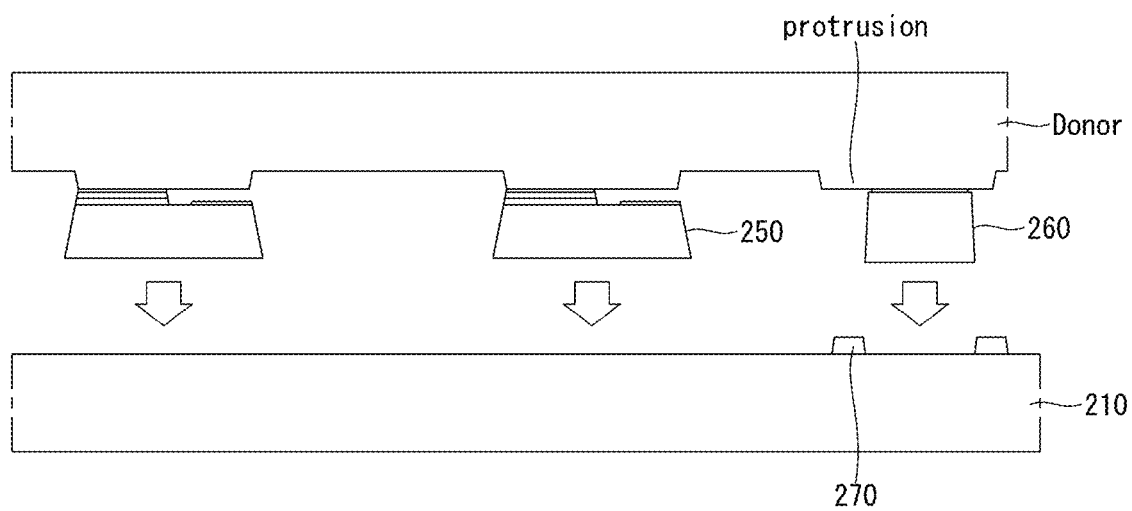

FIGS. 9A and 9B are schematic cross-sectional views illustrating a process of transplanting a light emitting chip and a structure mounted on a display device.

A micro light emitting element 250 is grown on a semiconductor wafer and patterned to complete an individual micro light emitting element 250. The micro light emitting element 250 on the semiconductor wafer is first transferred to a transfer substrate (Donor). The micro light emitting element 250 can be transplanted into the transfer substrate (Donor) by a method of separating the micro light emitting element 250 from the semiconductor wafer through a laser while the semiconductor wafer and the transfer substrate (Donor) are in contact with each other.

The transfer substrate (Donor) may be a polymeric material and a highly adhesive material such as polydimethylsiloxane (PDMS). A protrusion may be disposed on the transfer substrate (Donor) at a distance corresponding to a distance between the pixels of the display device. The protrusion allows the micro light emitting element 250 to be stably transplanted into the transfer substrate (Donor). The protrusion can be removed depending on the material of the transfer substrate (Donor) or the process conditions.

In this way, when the micro light emitting element 250 is transplanted into the transfer substrate (Donor), there is a need for an aligning step between the transfer substrate (Donor) and the semiconductor substrate (wafer). The semiconductor substrate (wafer) can be aligned with respect to the structure 260 on the semiconductor substrate (wafer) to minimize the process error.

Further, when the micro light emitting element 250 is transplanted into the transfer substrate (Donor), once the structure 260 is transported together, there is an advantage that the structure 260 can be used to adjust a precise position in disposing the micro light emitting element 250 in another transplanting process which can be performed after that. Thus, a process error that may occur in a process using a plurality of transfer substrates (Donor) and a plurality of semiconductor substrates (wafer) can be remarkably reduced.

Next, the micro light emitting element 250 transplanted into the transfer substrate (Donor) is subjected to a step of transplanting a light emitting element of an actual display device.

First, a step of aligning the transfer substrate (Donor) and a substrate 210 is performed, and a step of transplanting the structure 260 and the micro light emitting element 250 into the substrate 210 is performed. At this time, alignment between the substrate 210 and the transfer substrate (Donor) is performed using the second structure 270 and the structure 260. When the substrate 210 is brought into contact with the transfer substrate (Donor), as described above with reference to FIG. 5, an adhesive member 114 on the substrate 210 is in contact with a bottom surface of the structure 260 and the micro light emitting element 250. Adhesion between the substrate 210 and the micro light emitting element 250 is greater than that between the transfer substrate (Donor) and the micro light emitting element 250 by the adhesive member 114, so that the micro light emitting element 250 is transplanted into the substrate 210.

Transplanting the structure 260 together into the substrate 210 in the above-described steps may be beneficial in terms of reusing the transfer substrate (Donor). If the alignment state of the structure 260 and the second structure 270 on the substrate 210 is checked, a degree of failure of the final transplanting process can be examined at a later time. By reference to this, there is an advantage that a more precise electrode connection process can be performed by reflecting process deviation in the electrode connection process of the micro light emitting element 250.

It will be apparent to those skilled in the art that various modifications and variations can be made in the light emitting display device and the method of manufacturing the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a substrate having a plurality of pixels, each of the plurality of pixels including a light emitting chip; and
a structure on one side of at least one of the plurality of pixels,
wherein the structure has a different shape and configuration from the light emitting chip,
wherein a bottom surface of the structure contacts a same underlying layer as a bottom surface of the light emitting chip,
wherein a base material of the light emitting chip is the same as a base material of the structure, and
wherein the structure is spaced apart from the light emitting chip and does not constitute a portion of any other light emitting chip.

2. The display device of claim 1, wherein a distance between the structure and the light emitting chip is constant.

3. The display device of claim 1, wherein at least one driving element and a plurality of wiring electrodes are on the substrate, the light emitting chip is connected to the driving element and one of the wiring electrodes, and a second structure corresponding to the structure is on the substrate, and
wherein the second structure has a different shape from the structure and does not constitute a portion of any other light emitting chip.

4. The display device of claim 3, wherein the second structure is electrically connected to one of the wiring electrodes.

5. The display device of claim 3, wherein a surface of the second structure is surface treated with a material selected from Cr, Al, Au, and Ag.

6. The display device of claim 3, wherein a central axis of the second structure and a central axis of the structure are aligned so as to correspond to each other in a plan view.

7. The display device of claim 3, wherein the second structure has a shape selected from a circle, an ellipse, a cross, and a polygon in a plan view.

8. The display device of claim 3, wherein the second structure is arranged to surround the structure at two or more sides in a plan view.

9. The display device of claim 8, wherein when a distance from an inside of the second structure to the structure is considered, the structure corresponding to the second structure is equally spaced vertically and horizontally.

10. The display device of claim 3, wherein the structure is spaced apart from the second structure.

11. The display device of claim 3, further comprising:
an insulating layer between the structure and the second structure.

12. The display device of claim 1, wherein a top surface of the structure is surface treated with a material selected from Cr, Al, Au, and Ag.

13. The display device of claim 1, wherein the structure is between and spaced apart from the light emitting chip and another light emitting chip adjacent to the light emitting chip.

14. The display device of claim 1, wherein the light emitting chip is a light emitting chip selected from blue, green, red, and white light emitting chips.

15. The display device of claim 14, further comprising:
a color filter corresponding to the light emitting chip.

16. The display device of claim 1, wherein the plurality of pixels include different structures made of different base materials.

17. The display device of claim 16, wherein each of the pixels includes a plurality of light emitting chips emitting red, green, and blue light, respectively, and
wherein the plurality of light emitting chips includes the light emitting chip, and the structure is made of the same base material as the light emitting chip among the plurality of light emitting chips.

18. The display device of claim 1, wherein the structure is an alignment key for aligning the light emitting chip.

19. A display device, comprising:
a substrate having a plurality of pixels, one of the plurality of pixels including a light emitting chip;
a driving element and a wiring electrode on the substrate and connected to the light emitting chip;
a structure at one side of the one of the plurality of pixels;
a second structure between the structure and the substrate and electrically connected to the wiring electrode; and
a transparent electrode connected to the second structure and the wiring electrode,
wherein the structure has a different shape and configuration from the light emitting chip,
wherein a bottom surface of the structure contacts a same underlying layer as a bottom surface of the light emitting chip,
wherein a base material of the light emitting chip is the same as a base material of the structure, and
wherein the structure is spaced apart from the light emitting chip.

20. A display device, comprising:
a substrate having a plurality of pixels, one of the plurality of pixels including a light emitting chip;
a driving element and a wiring electrode on the substrate and connected to the light emitting chip;
a structure at one side of the one of the plurality of pixels;
a second structure between the structure and the substrate; and
an adhesive member between the structure and the second structure,
wherein the adhesive member is in contact with a lower portion of the structure and a lower portion of the light emitting chip,
wherein a base material of the light emitting chip is the same as a base material of the structure, and
wherein the structure is spaced apart from the light emitting chip.

* * * * *